(12) United States Patent
Yoon et al.

(10) Patent No.: US 10,249,503 B2
(45) Date of Patent: Apr. 2, 2019

(54) PRINTED CIRCUIT BOARD, SEMICONDUCTOR PACKAGE AND METHOD OF MANUFACTURING THE SAME

(71) Applicant: Samsung Electro-Mechanics Co., Ltd., Suwon-si (KR)

(72) Inventors: Kyoung-Ro Yoon, Daejeon (KR); Hyun-Kyung Park, Cheongju (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 474 days.

(21) Appl. No.: 15/007,557

(22) Filed: Jan. 27, 2016

(65) Prior Publication Data

US 2016/0315042 A1 Oct. 27, 2016

(30) Foreign Application Priority Data

Apr. 23, 2015 (KR) .................. 10-2015-0057191

(51) Int. Cl.

| | |
|---|---|
| *H05K 1/11* | (2006.01) |
| *H01L 21/288* | (2006.01) |
| *H01L 23/498* | (2006.01) |
| *H01L 21/48* | (2006.01) |
| *H01L 21/683* | (2006.01) |
| *H05K 1/14* | (2006.01) |

(52) U.S. Cl.
CPC ......... *H01L 21/288* (2013.01); *H01L 21/486* (2013.01); *H01L 21/4857* (2013.01); *H01L 21/6835* (2013.01); *H01L 23/49822* (2013.01); *H01L 23/49827* (2013.01); *H05K 1/113* (2013.01); *H05K 1/141* (2013.01); *H01L 2221/68345* (2013.01); *H01L 2224/16225* (2013.01); *H05K 2201/049* (2013.01); *H05K 2201/09036* (2013.01); *H05K 2201/09472* (2013.01); *H05K 2201/10242* (2013.01); *H05K 2201/10378* (2013.01)

(58) Field of Classification Search
CPC .......... H05K 2201/10242; H05K 2201/10378; H05K 2201/09472; H05K 2201/09609; H05K 2201/09636; H05K 2201/09827; H05K 2201/09863
See application file for complete search history.

(56) References Cited

U.S. PATENT DOCUMENTS

| | | | |
|---|---|---|---|
| 9,622,347 B2 * | 4/2017 | Oi ........................ | H05K 1/113 |
| 2008/0099230 A1 | 5/2008 | Takahashi et al. | |
| 2011/0155442 A1 * | 6/2011 | Yamada ............ | H01L 23/49822 174/266 |
| 2015/0014027 A1 * | 1/2015 | Kaneko .................. | H05K 1/113 174/255 |

* cited by examiner

*Primary Examiner* — Courtney L Smith
*Assistant Examiner* — Jessey R Ervin
(74) *Attorney, Agent, or Firm* — NSIP Law (57) ABSTRACT

Disclosed is a printed circuit board including an insulating layer, a circuit layer formed on a lower surface of the insulating layer, and a metal post contacting the circuit layer and extending from the lower surface to an upper surface of the insulating layer. The printed circuit board is able to prevent shorts while components are mounted by forming a metal post to have a secured height tolerance to connect with a die and to be in a caved shape into the board.

11 Claims, 6 Drawing Sheets

PRINTED CIRCUIT BOARD, SEMICONDUCTOR PACKAGE AND METHOD OF MANUFACTURING THE SAME

CROSS REFERENCE TO RELATED APPLICATION

This application claims the benefit under 35 USC § 119(a) of Korean Patent Application No. 10-2015-0057191 filed on Apr. 23, 2015 in the Korean Intellectual Property Office, the entire disclosure of which is incorporated herein by reference for all purposes.

BACKGROUND

1. Field

The following description relates to a printed circuit board, a semiconductor package, and a method of manufacturing the same.

2. Description of Related Art

Technologies which mount electronic components such as semiconductor chips, active elements, or passive elements in multilayer boards is being developed due to demands for lighter, thinner, and smaller electronic devices, including mobile phones, with more functions. Various technologies which embed components in the board have been developed.

A printed circuit board is prepared by printing circuit patterns with a conductive material such as Copper on an electro-insulating board and is a board made to mount an electronic component. The printed circuit board is a circuit board on which circuit patterns are printed to support mounting positions of electrically connect electronic components to allow for much higher component density.

In US Patent Publication No 2008-0099230, flex-rigid wiring board and method of manufacturing the same is disclosed. All documents cited in the present disclosure, including published documents, patent applications, and patents, may be incorporated herein in their entirety by reference in the same manner as when each cited document is separately and specifically incorporated or incorporated in its entirety.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a printed circuit, which is able to prevent shorts while components are mounted by forming a metal post to have a secured height tolerance to connect with a die and to be in a caved shape into the board.

In another general aspect, there is provided a method for manufacturing a printed circuit board is provided in which the printed circuit board is able to prevent shorts while components are mounted thereon by forming a metal post to have a secured height tolerance to connect with a die and to be in a caved shape into the board.

In another general aspect, there is provided a printed circuit board including an insulating layer, a circuit layer formed on a lower surface of the insulating layer, and a metal post contacting the circuit layer and extending from the lower surface to an upper surface of the insulating layer.

The upper surface of the insulating layer may be formed in a dimple shape to expose an upper surface of the metal post and a portion of a side surface of the metal post.

The metal post may include a first metal layer and a second metal layer abutting a surface of the first metal layer, and the second metal layer contacting the circuit layer.

The first metal layer and the second metal layer may be formed in a tapered shape, a cross-sectional dimension of the first metal layer may decrease from the upper surface towards the lower surface, and a cross-sectional dimension of the second metal layer may decrease from the lower surface towards the lower surface.

A diameter of a lower surface of the first metal layer may be greater than a diameter of an upper surface of the second metal layer.

The metal post may be formed of Cu or an alloy including Cu.

The printed circuit board may include a solder resist layer disposed on the insulating layer, the solder resist layer including opening parts to expose the first metal layer and the circuit layer.

The printed circuit board may include a build-up layer, and the build-up layer including a build-up insulating layer and a build-up circuit layer disposed on the circuit layer.

The insulation layer maybe hollowed-out in a concave shape to expose a portion of a side surface of the first metal layer distal from the second metal layer.

A diameter of a lower surface of the first metal layer may be equal to a diameter of an upper surface of the second metal layer.

In another general aspect, there is provided a semiconductor package including a printed circuit board including an insulating layer, a circuit layer formed on a lower surface of the insulating layer, and a metal post contacting the circuit layer and extending from the lower surface to an upper surface of the insulating layer, and a component mounted on an upper part of the printed circuit board.

The component may be connected to the metal post through an external contact terminal.

In another general aspect, there is provided a method for manufacturing a printed circuit board including forming a metallic material layer on opposing surfaces of a carrier board, forming a first metal layer by etching the metallic material layer, forming an insulating layer to bury the first metal layer, separating the carrier board, forming a second metal layer to electrically connect with the first metal layer, and processing the insulating layer in a dimple shape to expose a portion of a side surface of the first metal layer.

The forming of the second metal layer includes forming a circuit pattern on a surface of the insulating layer where the first metal layer is not exposed, forming a chemical copper plating on the insulating layer on which the circuit pattern is formed, and etching after forming a dry film on the chemical copper plating.

The forming of the circuit pattern includes forming a via passing through the insulating layer.

The method may include forming a solder resist layer, the solder resist layer including opening parts to expose a region of the first metal layer and the second metal layer.

The method may include forming a build-up layer including a build-up insulating layer and a build-up circuit layer on the second metal layer.

The first metal layer may be formed in a tapered shape with a decreasing cross-sectional dimension from an upper surface of the insulating layer towards the lower surface, and the second metal layer may be formed in a tapered shape with an increasing cross-sectional dimension from the upper surface towards the lower surface.

A diameter of a lower surface of the first metal layer may be greater than a diameter of an upper surface of the second metal layer.

The first metal layer and the second metal layer may be formed of Cu or an alloy including Cu.

The method may include performing a surface-treatment process on the exposed portion of the side surface of the first metal layer.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

Figure 1:
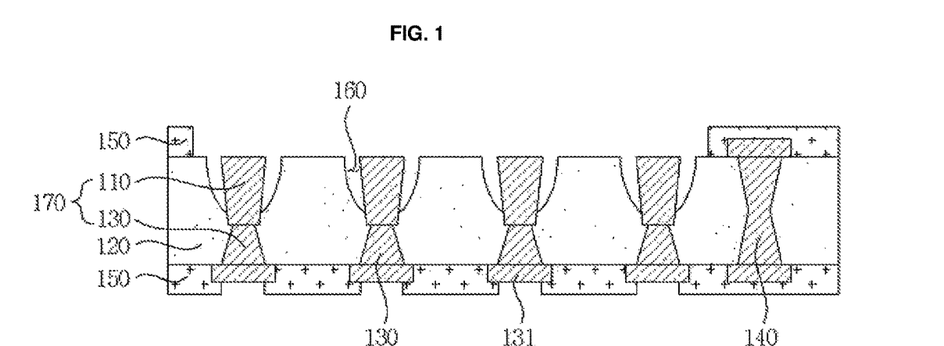
FIG. 1 is a diagram illustrating an example of a printed circuit board.
Figure 4:
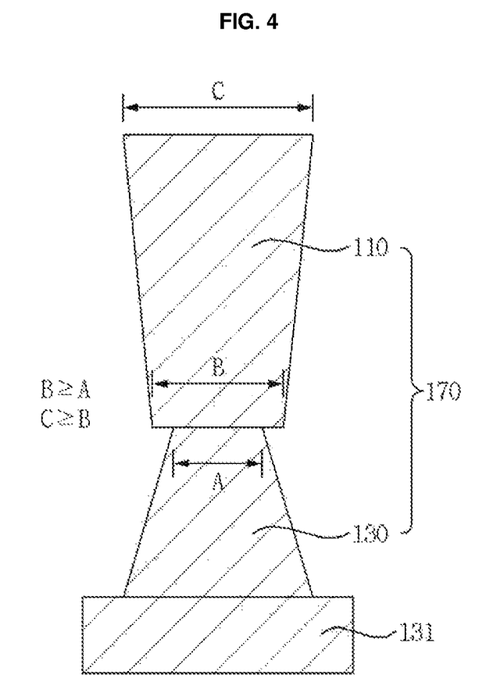
FIG. 4 is a diagram illustrating an example of a metal post.

FIG. 1 is a diagram illustrating an example of a printed circuit board and FIG. 4 is a diagram illustrating an example of a metal post.

As shown in FIG. 1, a printed circuit board includes an insulating layer 120, a circuit layer 131 formed on the lower surface of the insulating layer 120, a metal post 170, and a solder resist layer 150 having an opening part to expose the circuit layer 131. The metal post 170 extends from the lower surface to the upper surface of the insulating layer 120 and is connected to the circuit layer 131.

The upper surface of the insulating layer 120 may be shaped as a dimple 160 to expose the upper surface and a part of the side surface of the metal post 170. The insulating layer 120 may be formed to bury the metal post 170 in which the height of the insulating layer 120 is the same as that of the buried metal post 170. The dimple shape may be formed with a YAG laser or a $CO_2$ laser to expose a portion of the side surface of the metal post. A via 140 may be formed to pass through the insulating layer 120 using a YAG laser or a $CO_2$ laser to electrically connect the upper circuit layer and the lower circuit layer.

The insulating layer 120 may be formed of a material such as, for example, a thermosetting insulating material, a ceramic material, an organic-inorganic composite material, or a glass fiber. When the insulating layer 120 includes a polymer resin, the polymer resin may be an epoxy insulating resin such as, for example, FR-4, BT (Bismaleimide Triazine), ABF (Ajinomoto Build up Film) or a polyimide resin. However, it may not be limited thereto.

As shown in FIG. 4, the metal post 170 includes a first metal layer 110 and a second metal layer 130 formed on one surface of the first metal layer 110. The first metal layer 110 may be formed in a tapered shape with a decreasing cross-sectional dimension from the upper surface C to the lower surface B (C>B). The second metal layer 130 may be formed in a tapered shape with an increasing cross-sectional dimension from the upper surface A to the lower surface of the insulating layer 120. In an example, a diameter of the lower surface of the first metal layer 110 may be greater than a diameter of the upper surface of the second metal layer (B>A). The metal post 170 may be formed of a material, such as, for example, Cu or an alloy including Cu.

In another example, diameters of the lower surface and the upper surface of the first metal layer 110 may be the same as each other. In another example, and the diameter of the lower surface of the first metal layer 110 may be the same as the diameter of the upper surface of the second metal layer 130.

The first metal layer 110 may be formed in a caved shape to be exposed to one surface of the insulating layer 120 and the second metal layer 130. The first metal layer 110 may be formed by plating and filling the pattern formed to expose the first metal layer 110 from the other surface of the insulating layer 120.

The metal post may be formed by securing height tolerance to connect with a die so that shorts associated with a solder bridge may be prevented while a component is mounted.

The circuit layer 131 may be electrically connected with the second metal layer 130 by employing circuit pattern processes such as, for example, a subtractive process, an additive process, a semi additive process (SAP), or a modified semi additive process (MSAP).

The solder resist layer 150 may be formed to have opening parts to expose the region where the first metal layer 110 is formed and the circuit layer 131 on both surfaces of the insulating layer 120. The solder resist layer 150 may be formed to insulate the circuit pattern from the outside and to protect the board.

The opening part of the solder resist layer 150 may be formed by forming an opening part-forming dry film on the solder resist layer 150, patterning the dry film, and exposing and developing the result. The dry film may be formed through laminating and selectively hardened through an exposure process. The not-hardened regions of the dry film may be dissolved with a developing solution to pattern the opening part.

Figure 2:
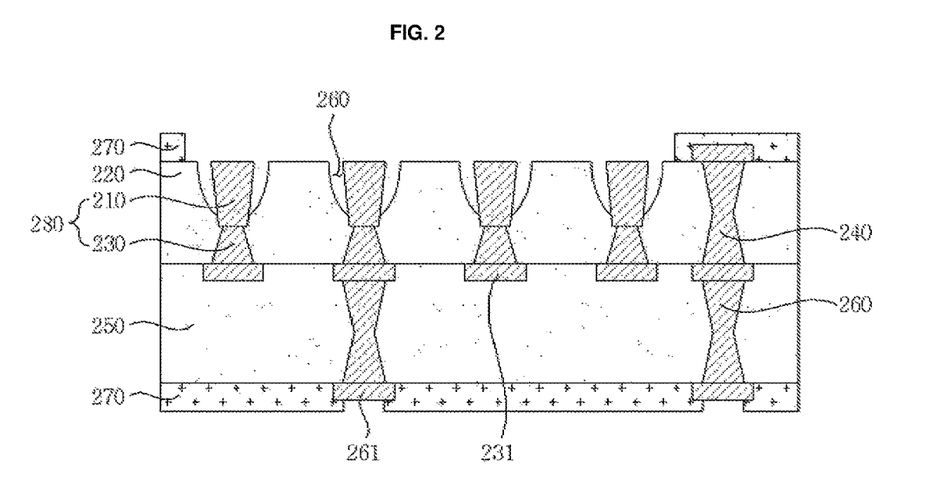
FIG. 2 is a diagram illustrating an example of a printed circuit board.

FIG. 2 is a diagram illustrating an example of a printed circuit board.

As shown in FIG. 2, a printed circuit board according to another example includes an insulating layer 220, a circuit layer 231 formed on the lower surface of the insulating layer, a metal post 280 connected with the circuit layer 231, a build-up layer, and a solder resist layer 270. The metal post 280 extends from the lower surface to the upper surface of the insulating layer 220. The build-up layer includes a build-up insulating layer 250 and a build-up circuit layer 261 formed on the circuit layer 231. The solder resist layer 270 includes opening parts to expose a region where a first metal layer 210 is formed and the build-up circuit layer 261.

In the example of FIG. 2, the printed circuit board includes the build-up layer in addition to the printed circuit board. The build-up layer may be built from the base 2L structure by laminating the first insulating layer and second insulating layer and the circuit layer to 4L→6L→8L→10L. The build-up layer may not be limited thereto. The solder resist layer may be formed on the outmost circuit layer of the build-up layer using a solder resist material. The above description of FIG. 1, is also applicable to FIG. 2, and is incorporated herein by reference. Thus, the above description may not be repeated here.

Figure 3:
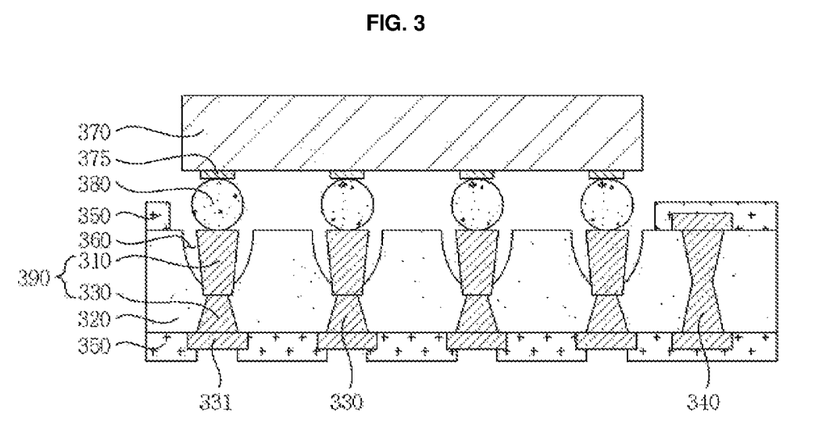
FIG. 3 is a diagram illustrating an example of a semiconductor package.

FIG. 3 is a diagram illustrating an example of a semiconductor package. As shown in FIG. 3, a semiconductor package includes a printed circuit board including an insulating layer 320; a circuit layer 331 formed on the lower surface of the insulating layer 320; a metal post 390 connected with the circuit layer 331 and extending from the lower surface to the upper surface of the insulating layer 320; a component 370 mounted on the upper part of the printed circuit board; and an external contact terminal 380 configured to electrically connect the metal post 390 with the component 370.

A metal pad 375 is formed on a lower surface of the component 370. The metal post 390 buried in the printed circuit board may be connected and mounted through the external contact terminal 380.

The metal post 390 may be formed in a dimple shape to expose a part thereof to prevent shorts caused by a solder bridge when the external contact terminal 380 is soldered and connected.

FIG. 5 to FIG. 16 are diagrams illustrating examples of a method for manufacturing a printed circuit board. The above description of FIGS. 1-4, is also applicable to FIGS. 5-16, and is incorporated herein by reference. Thus, the above description may not be repeated here.

Figure 5:
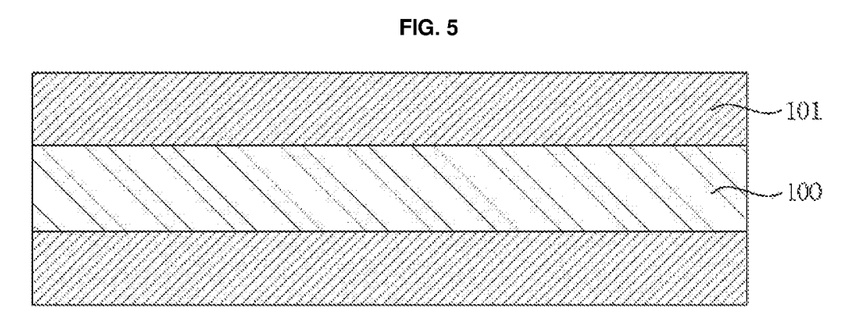
FIG. 5 to FIG. 16 are diagrams illustrating examples of a method for manufacturing a printed circuit board.

As shown in FIG. 5, a metallic material layer 101 may be formed on both surfaces of a carrier board 100. The carrier board 100 may be a detachable dummy board and the metallic material layer 101 with a predetermined height may be formed on both surfaces of the carrier board 100. In an example, the metallic material layer 101 may be made of copper and may have a thickness of 35 μm or greater.

Figure 6:
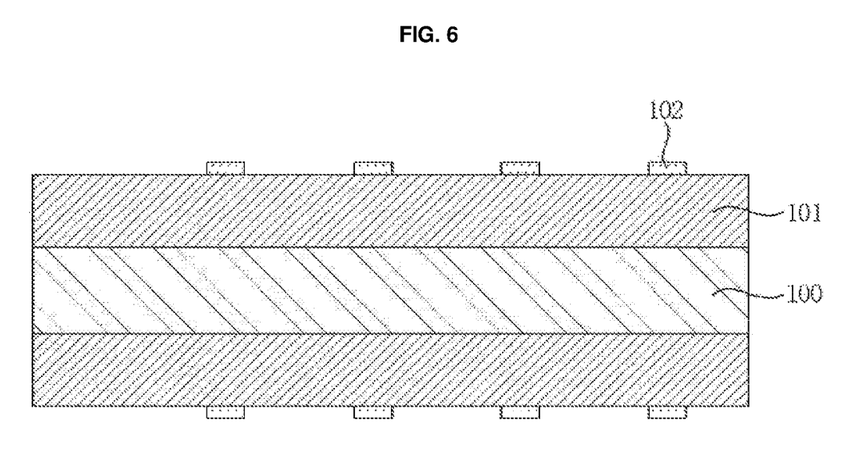
Figure 7:
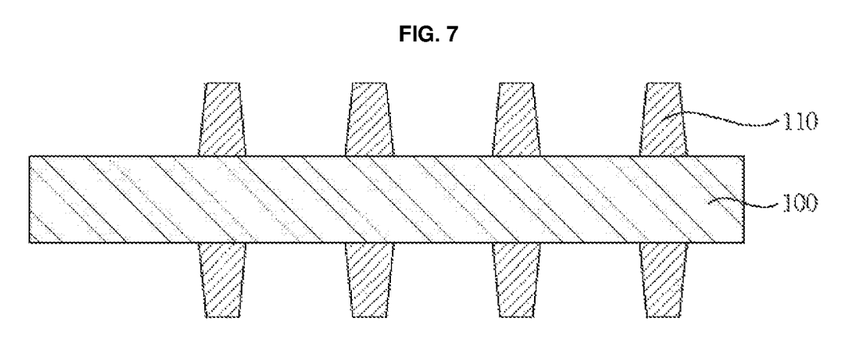

As shown in FIG. 6 and FIG. 7, a first metal layer 110 may be formed by etching the metallic material layer 101.

After forming an etching resist 102 as a dry film on the metallic material layer 101, the metallic material layer 101 may be selectively eliminated to form the first metal layer 110. In an example, the first metal layer 110 may be formed by employing one of a subtractive process, an additive process, a semi additive process (SAP), or a modified semi additive process (MSAP). The etched first metal layer may be formed in a tapered shape with an increasing cross-sectional from the upper surface to the lower surface.

Figure 8:
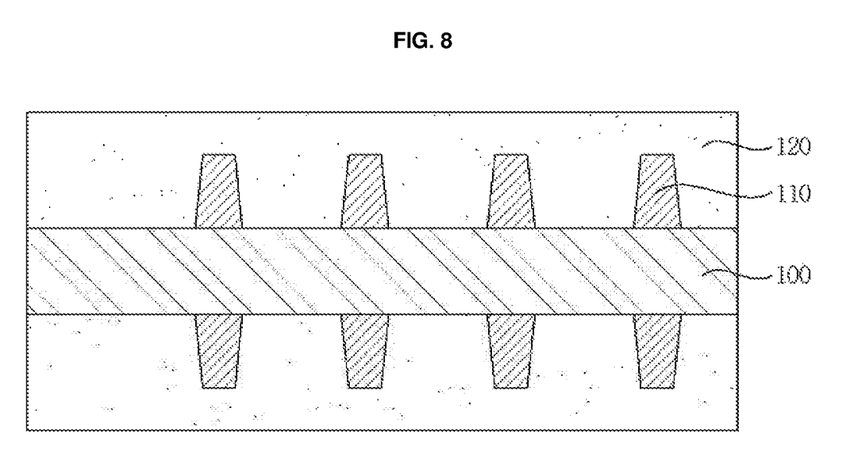

As shown in FIG. 8, an insulating layer 120 may be formed to cover the first metal layer 110. The insulating layer 120 may be formed in a prepreg layer through a laminating process. The insulating layer 120 may be formed of a material such as, for example, a thermosetting or thermoplastic polymer material, a ceramic material, an organic-inorganic composite material, or a glass fiber. When the insulating layer 120 includes a polymer resin, the polymer resin may be an epoxy insulating resin such as FR-4, BT (Bismaleimide Triazine), ABF (Ajinomoto Build up Film) or a polyimide resin. However, it may not be limited thereto.

Figure 9:
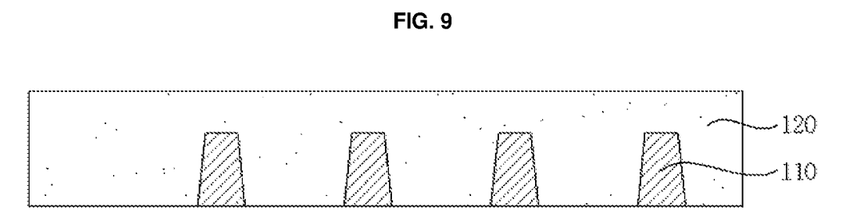

As shown in FIG. 9, the carrier board 100 on which the insulating layer 120 is formed on the both surfaces is separated.

Figure 10:
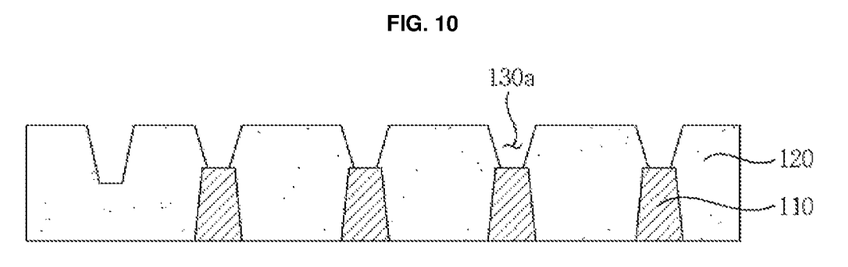
Figure 11:
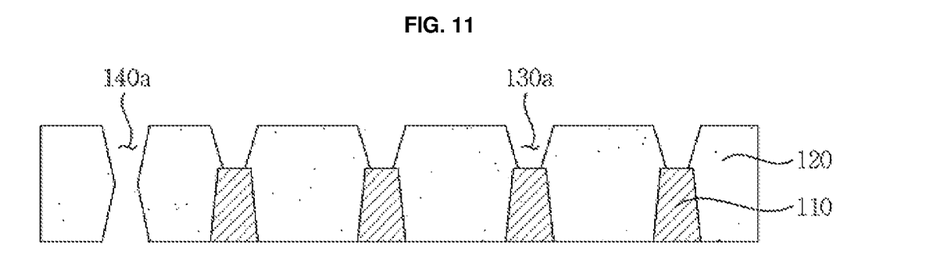

As shown in FIG. 10 and FIG. 11, a circuit pattern may be formed on one surface of the insulating layer 120 in which the first metal layer 110 is buried, i.e., the first metal layer is not exposed through this surface of the insulating layer 120.

The insulating layer 120 may be divided into one surface on which the first metal layer 110 is buried and the other surface through which the first metal layer 110 is exposed after the carrier board 100 is separated. The circuit pattern may be formed to be connected with the first metal layer 110 buried in the surface of the first insulating layer 120 where the first metal layer 110 is buried.

A via hole 130a and a through via hole 140a may be formed to expose the first metal layer by drilling the insulating layer 120 to form the circuit pattern. The via hole may be formed using a YAG laser or a $CO_2$ laser in the insulating layer 110. When the via hole is formed using such a drill, it may be formed in a tapered shape with a decreasing cross-sectional from top to bottom. Thus, a diameter of the via hole 130a may become smaller toward the exposed surface of the first metal layer.

In another example, the through via hole 140a is formed by drilling from the both surfaces of the insulating layer so that the through hole may be formed in a tapered shape with a decreasing cross-sectional toward the center from the both surfaces.

Figure 12:
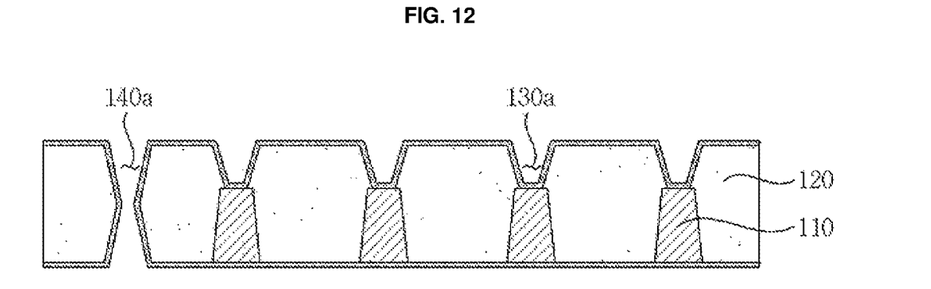
Figure 13:
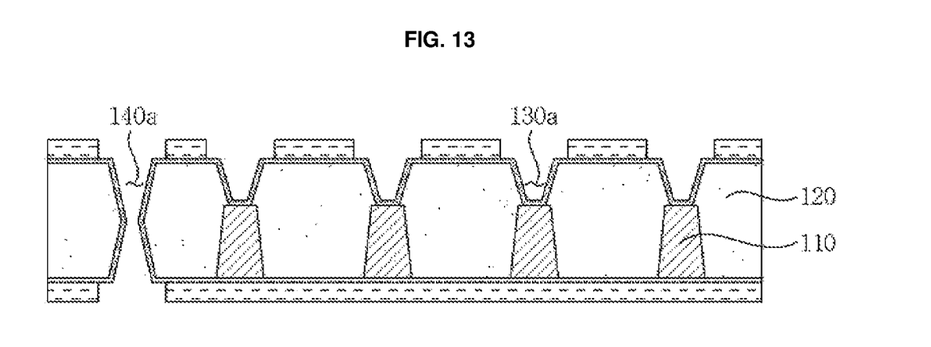

As shown in FIG. 12 and FIG. 13, a chemical copper plating may be formed on the insulating layer on which the circuit pattern including the via hole and the through via hole are formed, and a dry film may be formed on the circuit pattern through patterning.

Figure 14:
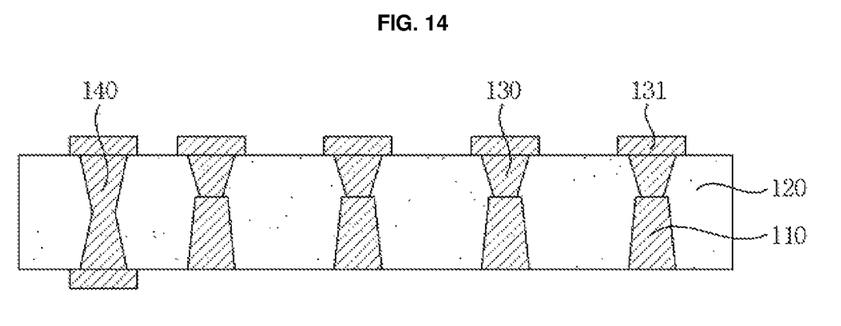

As shown in FIG. 14, a second metal layer 130 and a circuit layer 131 may be formed to electrically connect to the first metal layer 110. The second metal layer 130 may be formed by filling a metallic material into the via hole 130a and the through via hole 140a. The circuit layer 131 may be formed as an outer layer. The second metal layer 130 and the circuit layer 131 may be formed by employing a semi additive process (SAP) or a modified semi additive process (MSAP). The second metal layer 130 and the circuit layer 131 may be formed by employing any known circuit pattern forming methods such as a subtractive process, an additive process, a semi additive process (SAP), and a modified semi additive process (MSAP) without any limitation.

As shown in FIG. 4. the first metal layer 110 may be formed in a tapered shape with a decreasing cross-sectional from the upper surface C to the lower surface B (C>B), and the second metal layer 130 may be formed in a tapered shape with an increasing cross-sectional dimension from the upper surface A to the lower surface. In an example, a diameter of the lower surface of the first metal layer 110 may be greater than a diameter of the upper surface of the second metal layer 130 (B>A). The metal post 170 may be formed of Cu or an alloy including Cu.

In another example, diameters of the lower surface and the upper surface of the first metal layer 110 may be the same, and the diameter of the lower surface of the first metal layer 110 may be the same as that of the upper surface of the second metal layer 130.

Figure 15:
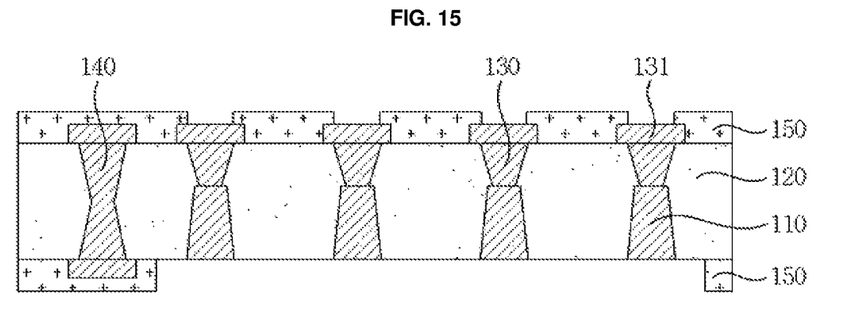

As shown in FIG. 15, a solder resist layer 150 may be formed. The solder resist layer 150 may have opening parts to expose the region where the first metal layer 110 is formed and the circuit layer 131 is formed on both surfaces of the insulating layer 120. The solder resist layer 150 may be formed to insulate the circuit pattern from the outside and to protect the board.

The opening part of the solder resist layer 150 may be formed by forming an opening part-forming dry film on the solder resist layer 150, patterning the dry film, and exposing and developing the result. The dry film may be formed through laminating and then selectively hardened through an exposure process. The not-hardened regions may be dissolved with a developing solution to pattern the opening part.

Figure 16:
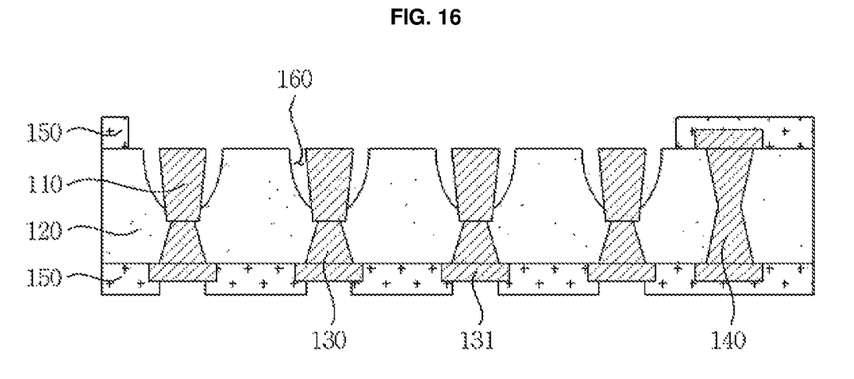

As shown in FIG. 16, the insulating layer 120 may be processed in a dimple shape 160 to expose a part of the side surface of the first metal layer 110. In an example, the insulating layer 120 may be processed in a dimple shape 160 to expose a part of the side surface of the metal post 170 using a YAG laser or a $CO_2$ laser.

Therefore, when an external contact terminal is soldered and adhered to mount a semiconductor component, the dimple shape 160, formed to expose a part of the side surface of the metal post 170 including the first metal layer 110 and the second metal layer 130, may prevent occurrence of shorts caused by the solder bridge.

After processing the insulating layer 120 in the dimple shape 160, a surface treatment process may be performed on the exposed first metal layer 110.

A build-up layer including a build-up insulating layer and a build-up circuit layer may be formed on the circuit layer 131 of the second metal layer. The build-up layer may be built from the base 2L structure by laminating the first insulating layer and second insulating layer and the circuit layer to 4L→6L→8L→10L. The build-up layer may not be limited thereto. The solder resist layer may be formed on the outmost circuit layer of the build-up layer using a solder resist material.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF REFERENCE NUMERALS 110, 210, 310 - - - First metal layer
120, 220, 320 - - - Insulating layer
130, 230, 330 - - - Second metal layer
131, 231, 331 - - - Circuit layer
150, 270, 350 - - - Solder resist
160 - - - Dimple
170, 280, 390 - - - Metal post

What is claimed is:

1. A printed circuit board comprising:
an insulating layer;
a circuit layer disposed on a lower surface of the insulating layer; and
a metal post,
wherein a side surface of the metal post contacts the insulating layer, and the metal post extends from the lower surface of the insulating layer to an upper surface of the insulating layer; and
wherein a portion of the side surface of the metal post is spaced apart from the insulating layer.

2. The printed circuit board of claim 1, wherein the upper surface of the insulating layer is in a dimple shape.

3. The printed circuit board of claim 1, wherein the metal post comprises a first metal layer and a second metal layer abutting a surface of the first metal layer and contacting the circuit layer.

4. The printed circuit board of claim 3, wherein:
the first metal layer and the second metal layer are in a tapered shape;
a cross-sectional dimension of the first metal layer decreases from the upper surface of the insulating layer towards the lower surface of the insulating layer, and
a cross-sectional dimension of the second metal layer decreases from the lower surface of the insulating layer towards the upper surface of the insulating layer.

5. The printed circuit board of claim 4, wherein a diameter of a lower surface of the first metal layer is greater than a diameter of an upper surface of the second metal layer.

6. The printed circuit board of claim 1, wherein the metal post is formed of Cu or an alloy comprising Cu.

7. The printed circuit board of claim 1, further comprising a solder resist layer disposed on the insulating layer, the solder resist layer comprising opening parts to expose the first metal layer and the circuit layer.

8. The printed circuit board of claim 1, further comprising a build-up layer comprising a build-up insulating layer and a build-up circuit layer disposed on the circuit layer.

9. The printed circuit board of claim 3, wherein the insulation layer is hollowed-out in a concave shape such that a portion of a side surface of the first metal layer is spaced apart from the insulating layer.

10. A semiconductor package comprising:
a printed circuit board comprising
an insulating layer;
a circuit layer disposed on a lower surface of the insulating layer;
a metal post;
and a component mounted on an upper part of the printed circuit board, wherein a side surface of the metal post contacts the insulating layer, and the metal post extends from the lower surface of the insulating layer to an upper surface of the insulating layer; and wherein a portion of the side surface of the metal post is spaced apart from the insulating layer.

11. The semiconductor package of claim 10, wherein the component is connected to the metal post through a contact terminal external to the printed circuit board.

* * * * *